(12) United States Patent
Nakano et al.

(10) Patent No.: US 10,998,243 B2
(45) Date of Patent: May 4, 2021

(54) METHOD OF MANUFACTURING SEMICONDUCTOR DEVICE

(71) Applicant: SUMITOMO ELECTRIC DEVICE INNOVATIONS, INC., Kanagawa (JP)

(72) Inventors: Takuma Nakano, Yokohama (JP); Tomoki Maruyama, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/423,977

(22) Filed: May 28, 2019

(65) Prior Publication Data

US 2019/0371672 A1 Dec. 5, 2019

(30) Foreign Application Priority Data

May 29, 2018 (JP) .............................. JP2018-102475

(51) Int. Cl.
*H01L 21/8258* (2006.01)
*H01L 27/06* (2006.01)
*H01L 21/02* (2006.01)
*H01L 21/311* (2006.01)

(52) U.S. Cl.
CPC ...... *H01L 21/8258* (2013.01); *H01L 27/0605* (2013.01); *H01L 21/0217* (2013.01); *H01L 21/02164* (2013.01); *H01L 21/02274* (2013.01); *H01L 21/31111* (2013.01); *H01L 21/31116* (2013.01)

(58) Field of Classification Search
CPC ............. H01L 21/8258; H01L 27/0605; H01L 21/02164; H01L 21/31111; H01L 21/02274; H01L 21/31116; H01L 21/0217; H01L 29/66462; H01L 29/7786; H01L 29/2003; H01L 29/402; H01L 27/0629; H01L 28/60
See application file for complete search history.

(56) References Cited

U.S. PATENT DOCUMENTS

| 10,290,701 | B1 * | 5/2019 | Chang | ...................... H01L 28/55 |
| 2003/0085412 | A1 * | 5/2003 | Nakamura | ........... H01L 21/8252 |
| | | | | 257/197 |
| 2004/0198253 | A1 * | 10/2004 | Kondo | ................ H01L 23/5223 |
| | | | | 455/91 |

(Continued)

FOREIGN PATENT DOCUMENTS

JP 2014-56887 3/2014

*Primary Examiner* — Ahmed N Sefer
(74) *Attorney, Agent, or Firm* — Smith, Gambrell & Russell, LLP.

(57) ABSTRACT

A method of manufacturing a semiconductor device includes forming a field plate on an insulating film covering a transistor, the field plate being electrically coupled to a gate of the transistor via the insulating film, and the transistor being located on a substrate, forming a silicon nitride protective film covering the insulating film and the field plate, forming a silicon oxide base film on the silicon nitride protective film, and forming a MIM capacitor on the silicon oxide base film. The MIM capacitor includes a first electrode, a dielectric film and a second electrode which are stacked in an order. Forming the MIM capacitor includes performing wet etching on the silicon oxide base film on the field plate after forming the dielectric film.

6 Claims, 7 Drawing Sheets

(56) References Cited

U.S. PATENT DOCUMENTS

| | | | |
|---|---|---|---|
| 2006/0054960 A1* | 3/2006 | Seo | H01L 21/76838 |
| | | | 257/306 |
| 2007/0069384 A1* | 3/2007 | Watanabe | H01L 23/5226 |
| | | | 257/758 |
| 2013/0032805 A1* | 2/2013 | Kim | H01L 27/3258 |
| | | | 257/59 |
| 2015/0102344 A1* | 4/2015 | Song | H01L 27/1255 |
| | | | 257/59 |
| 2015/0357206 A1* | 12/2015 | McClymonds | H01L 21/32139 |
| | | | 257/532 |
| 2016/0133679 A1* | 5/2016 | Jeon | H01L 27/1255 |
| | | | 257/40 |
| 2018/0061697 A1* | 3/2018 | Yamada | H01L 28/75 |
| 2018/0204904 A1* | 7/2018 | Yoshida | H01L 21/31116 |

* cited by examiner

METHOD OF MANUFACTURING SEMICONDUCTOR DEVICE

CROSS REFERENCE TO RELATED APPLICATIONS

This application claims the priority benefit of Japanese Application No. JP2018-102475 filed on May 29, 2018, the entire contents of which are incorporated herein by references.

TECHNICAL FIELD

The present disclosure relates to a method of manufacturing a semiconductor device.

BACKGROUND

When forming a high electron mobility transistor (HEMT), a multilayer capacitor may be provided. For example, in Japanese Unexamined Patent Publication No. 2014-56887, a method of manufacturing a capacitor (MIM capacitor) of a metal-insulator-metal (MIM) structure having a lower electrode, a dielectric film, and an upper electrode provided on a semiconductor substrate is disclosed. In Japanese Unexamined Patent Publication No. 2014-56887, by forming a silicon oxide base film immediately under the MIM capacitor, reduction of a leakage current in the MIM capacitor, or the like can be achieved. A portion of the silicon oxide base film that does not overlap the MIM capacitor is removed.

For example, when forming a field effect transistor including a field plate on a substrate and the MIM capacitor disclosed in Japanese Unexamined Patent Publication No. 2014-56887, the field plate is provided on an insulating film covering the field effect transistor. The insulating film is exposed from the silicon oxide base film, and a film quality thereof deteriorates when the silicon oxide base film is removed by the hydrofluoric acid solution. As a result, a withstand voltage between a gate and the field plate becomes lower than expected, and the life of the field effect transistor deteriorates.

SUMMARY

A method of manufacturing a semiconductor device according to an aspect of the present disclosure includes: forming a field plate on an insulating film covering a transistor, the field plate being electrically coupled to a gate of the transistor via the insulating film, and the transistor being located on a substrate; forming a silicon nitride protective film covering the insulating film and the field plate; forming a silicon oxide base film on the silicon nitride protective film; and forming a MIM capacitor on the silicon oxide base film, the MIM capacitor including a first electrode, a dielectric film and a second electrode which are stacked in an order on the silicon oxide base film. The forming the MIM capacitor includes performing wet etching on the silicon oxide base film on the field plate after forming the dielectric film.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Figure 1:
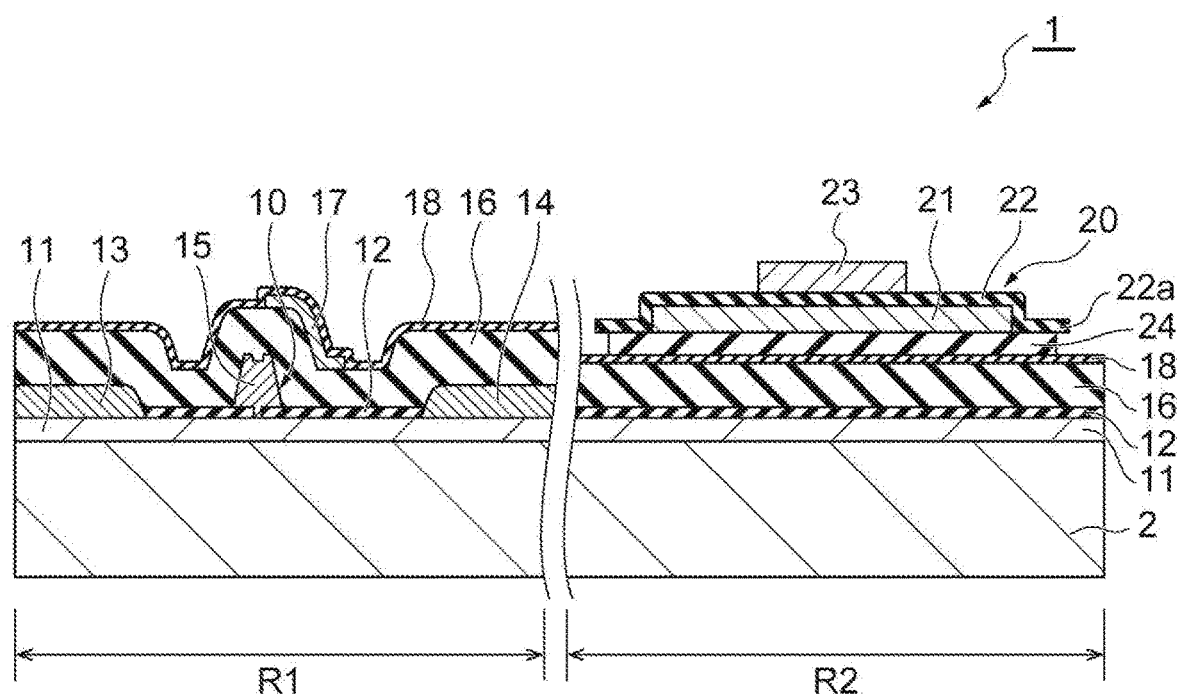
FIG. 1 is a cross-sectional view illustrating a semiconductor device manufactured by a method of manufacturing according to an embodiment.

A specific example of a method of manufacturing a semiconductor device according to an embodiment of the present disclosure will be described below with reference to the drawings. The present disclosure is not limited to the exemplifications, is represented by the claims, and it is intended all modifications will be included within the scopes and meanings equivalent to the claims. In the descriptions below, the same reference numerals are given to the same elements in the description of the drawings, and the descriptions thereof will not be repeated.

FIG. 1 is a cross-sectional view illustrating a semiconductor device manufactured by a method of manufacturing according to an embodiment. As illustrated in FIG. 1, a semiconductor device 1 including a transistor 10 and a MIM capacitor 20 is provided on a substrate 2. The transistor 10 and the MIM capacitor 20 included in the semiconductor device 1 are provided on positions on the substrate 2 different from each other. In the present embodiment, the transistor 10 is formed in a first region R1 on the substrate 2, and the MIM capacitor 20 is formed in a second region R2 on the substrate 2. The substrate 2 is a substrate for crystal growth. Examples of the substrate 2 include a SiC substrate, a GaN substrate, or a sapphire ($Al_2O_3$) substrate. In the present embodiment, the substrate 2 is the SiC substrate.

The transistor 10 positioned in the first region R1 includes a semiconductor stack 11, a passivation film 12, a source 13, a drain 14, and a gate 15. In addition, an insulating film 16, a field plate 17 and a silicon nitride protective film 18 are provided on the transistor 10.

The semiconductor stack 11 is a laminate of semiconductor layers epitaxially grown on the substrate 2. The semiconductor stack 11 includes, for example, a buffer layer, a channel layer, a barrier layer, and a cap layer in an order from a surface of the substrate 2. The transistor 10 in the present embodiment is a high electron mobility transistor (HEMT). Two-dimensional electron gas (2DEG) is generated on the channel layer side of the interface between the channel layer and the barrier layer so that a channel region is formed on the channel layer. The buffer layer is, for example, an AlN layer. The channel layer is, for example, a GaN layer. The barrier layer is, for example, an AlGaN layer. The cap layer is, for example, a GaN layer. The semiconductor stack 11 is provided not only in the first region R1 but also in the second region R2. Hereinafter, the direction in which each of the layers included in the semiconductor stack 11 are laminated is simply referred to as a lamination direction, and a direction orthogonal to the lamination direction is referred to as a horizontal direction.

The passivation film 12 is a protective film that protects the surface of the semiconductor stack 11 and is provided on the semiconductor stack 11. The passivation film 12 may include, for example, a first insulating film and a second insulating film. From a viewpoint that an etching resistance in the first insulating film is higher than in the second insulating film, the first insulating film may be formed by low pressure chemical vapor deposition (LPCVD). The LPCVD method is a method in which a dense film is formed by reducing the film forming pressure and raising the film forming temperature. The lower limit value of the thickness of the first insulating film is, for example, 10 nm, and the upper limit value of that is, for example, 50 nm. The second insulating film is provided on the first insulating film. From a viewpoint that the etching resistance in the second insulating film is lower than that in the first insulating film, the second insulating film may be formed by a plasma CVD method. The film forming temperature in the plasma CVD method is lower than the film forming temperature in the LPCVD method. Thus, the film quality of the second insulating film is less dense than that of the first insulating film. A Si composition of the second insulating film is smaller than a Si composition of the first insulating film. In addition, the refractive index of the second insulating film is smaller than the refractive index of the first insulating film. The lower limit value of the thickness of the second insulating film is, for example, 30 nm, and the upper limit value thereof is, for example, 500 nm.

The source 13 and the drain 14 are provided on the semiconductor stack 11. The source 13 and the drain 14 contact the barrier layer of the semiconductor stack 11, for example. The source 13 and the drain 14 are ohmic electrodes, and are formed, for example, by alloying a laminated structure of a titanium (Ti) layer and an aluminum (Al) layer. The source 13 and the drain 14 may be formed by further alloying the result of laminating another Ti layer on the Al layer. In addition, the tantalum (Ta) layer can be employed instead of the Ti layer.

The gate 15 is provided between the source 13 and the drain 14. The gate 15 includes, for example, a material that is in a Schottky contact with the cap layer of semiconductor stack 11. The gate 15 has, for example, a laminated structure of a nickel (Ni) layer and a gold (Au) layer. In this case, the Ni layer is in the Schottky contact with the cap layer.

The insulating film 16 is an insulating film covering the transistor 10. The thickness of the insulating film 16 is, for example, equal to or thicker than 150 nm and equal to or thinner than 400 nm. In the present embodiment, the insulating film 16 is a silicon nitride film. The insulating film 16 is provided not only in the first region R1 but also in the second region R2. The insulating film 16 provided in the second region R2 covers the surface of the semiconductor stack 11 and is positioned between the semiconductor stack 11 and the MIM capacitor 20.

The field plate 17 is a conductive layer electrically coupled to the gate 15 of the transistor 10 via the insulating film 16, and is provided on the insulating film 16. The field plate 17 may have a single layer structure or may have a multilayer structure. In the present embodiment, the field plate 17 has a laminated structure of a titanium layer (Ti layer) and a gold layer (Au layer). The thickness of the Ti layer is, for example, equal to or thicker than 3 nm and equal to or thinner than 10 nm, and the thickness of the Au layer is, for example, equal to or thicker than 200 nm and equal to or thinner than 400 nm.

The silicon nitride protective film 18 is an insulating film covering the insulating film 16 and the field plate 17. The thickness of the silicon nitride protective film 18 is, for example, equal to or thicker than 20 nm and equal to or thinner than 200 nm. The silicon nitride protective film 18 is provided not only in the first region R1 but also in the second region R2. The silicon nitride protective film 18 provided in the second region R2 is positioned between the insulating film 16 and the MIM capacitor 20.

The MIM capacitor 20 positioned in the second region R2 includes a first electrode 21, a dielectric film 22 and a second electrode 23 stacked in an order along the lamination direction. In the second region R2, the MIM capacitor 20 is provided on the silicon oxide base film 24. The silicon oxide base film 24 is an insulating film which functions as a base film of the MIM capacitor 20, and is provided in the second region R2. A distance between the substrate 2 and the first electrode 21 increases by providing the silicon oxide base film 24, the leakage current from the first electrode 21 to the substrate 2 can be reduced. The thickness of the silicon oxide base film 24 is, for example, equal to or thicker than 100 nm and equal to or thinner than 400 nm.

The first electrode 21 is a conductive layer positioned at the lower side (substrate 2 side) of the MIM capacitor 20, and is provided on the silicon oxide base film 24. The first electrode 21 is, for example, a gold-based metal layer. The first electrode 21 may have a single layer structure or may have a multilayer structure. The thickness of the first electrode 21 is, for example, equal to or thicker than 100 nm and equal to or thinner than 400 nm.

The dielectric film 22 is an insulating layer positioned between the first electrode 21 and the second electrode 23, and covers the first electrode 21. Therefore, the dielectric film 22 contacts not only the first electrode 21 but also the silicon oxide base film 24, and the first electrode 21 is sealed by the dielectric film 22 and the silicon oxide base film 24. The dielectric film 22 is, for example, a silicon nitride film. The thickness of the dielectric film 22 is, for example, equal to or thicker than 50 nm and equal to or thinner than 400 nm.

End portions 22a of the dielectric film 22 protrude to the outer side of the side surfaces of the silicon oxide base film 24 in the horizontal direction, and thus, the side surfaces of the silicon oxide base film 24 are exposed. Therefore, the end portions 22a of the dielectric film 22 becomes an eave of the silicon oxide base film 24, and separated the silicon oxide base film 24 from the insulating films 16 and 18. In this way, the leakage current from the dielectric film 22 to the substrate 2 via the insulating film 16 and silicon nitride protective film 18 can be reduced. The end portions 22a of the dielectric film 22 protrude from the side surfaces of the silicon oxide base film 24 as much as a range of equal to or longer than 0.5 μm to equal to or shorter than 2 μm, for example. In this case, the leakage current can be reduced while securing the structural strength of the end portion 22a. The range described above may be equal to or longer than 0.5 μm and equal to or shorter than 1.0 μm.

The second electrode 23 is a conductive layer positioned on the upper side of the MIM capacitor 20, and is provided on the dielectric film 22. The second electrode 23 may overlap the entire of the first electrode 21 or may overlap a part of the first electrode 21. The second electrode 23 is, for example, a gold-based metal layer. The second electrode 23 may have a single layer structure or may have a multilayer structure. The thickness of the second electrode 23 is, for example, equal to or thicker than 100 nm and equal to or thinner than 400 nm less.

Next, an example of a method of manufacturing the semiconductor device according to the present embodiment will be described with reference to FIG. 2A to FIG. 4B. FIG. 2A, FIG. 2B, FIG. 3A, FIG. 3B, FIG. 4A, and FIG. 4B are diagrams illustrating the method of manufacturing the semiconductor device 1 according to the present embodiment.

Figure 2A:
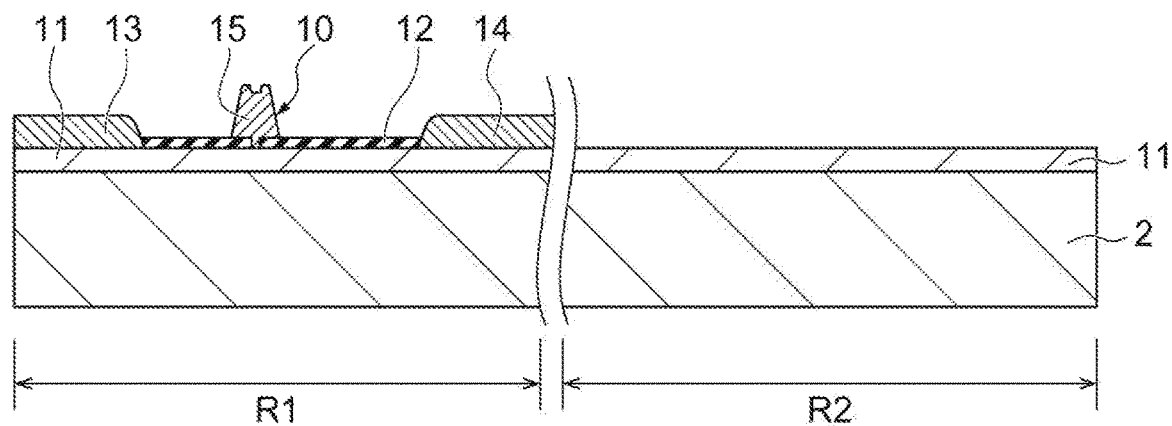
FIG. 2A and FIG. 2B are diagrams for explaining the method of manufacturing the semiconductor device according to the embodiment.

First, as illustrated in FIG. 2A, the transistor 10 is formed on the substrate 2 (a first step). In the first step, firstly, the semiconductor stack 11 is grown on the substrate 2 by metal organic chemical vapor deposition (MOCVD). Next, the transistor 10 is formed by forming the passivation film 12, the source 13, the drain 14 and the gate 15 in the first region R1. The source 13, the drain 14 and the gate 15 are formed, for example, by an evaporation method and a lift-off method.

Before a completion of the forming of the transistor 10, the passivation film 12 covering the substrate 2 on which the semiconductor stack 11 is grown is formed. In forming the passivation film 12, the first insulating film formed by the LPCVD method and the second insulating film formed by the plasma CVD method may be formed. When performing the LPCVD method, the film forming temperature is, for example, equal to or higher than 800° C. and equal to or lower than 900° C., and the film forming pressure is, for example, equal to or higher than 10 Pa and equal to or lower than 100 Pa. When performing the plasma CVD method, the film forming temperature is, for example, equal to or higher than 300° C. and equal to or lower than 350° C., and the film forming pressure is, for example, equal to or higher than 50 Pa and equal to or lower than 200 Pa. In the source 13 and the drain 14, alloying may be performed to form the ohmic electrode. The evaporation method includes, for example, a resistance heating evaporation method, a sputtering evaporation method, an electron beam evaporation method, or the like.

Figure 2B:
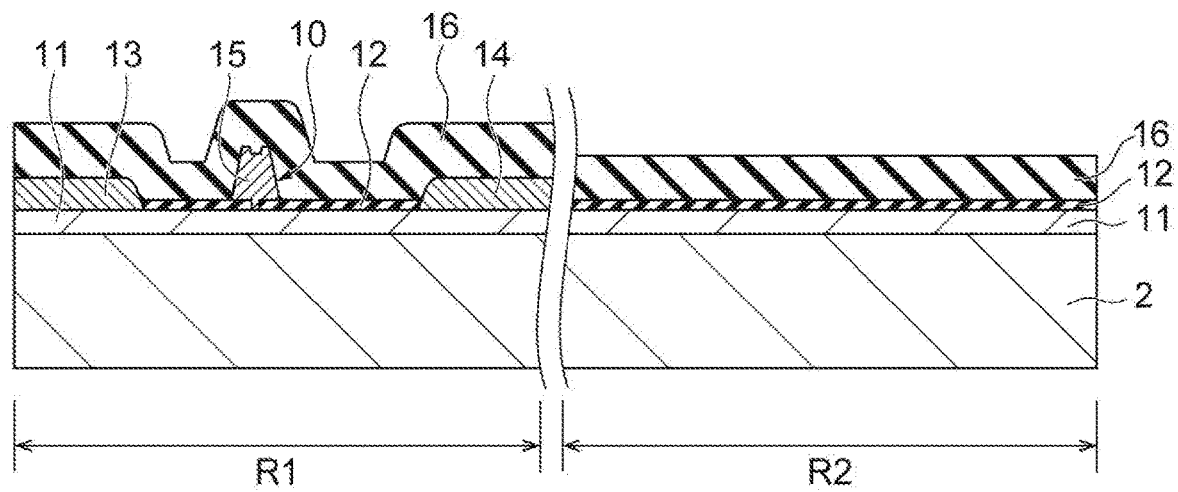

Next, as illustrated in FIG. 2B, the transistor 10 is covered by the insulating film 16 (a second step). In the second step, for example, the insulating film 16 which is a silicon nitride film, is formed by the plasma CVD method.

Figure 3A:
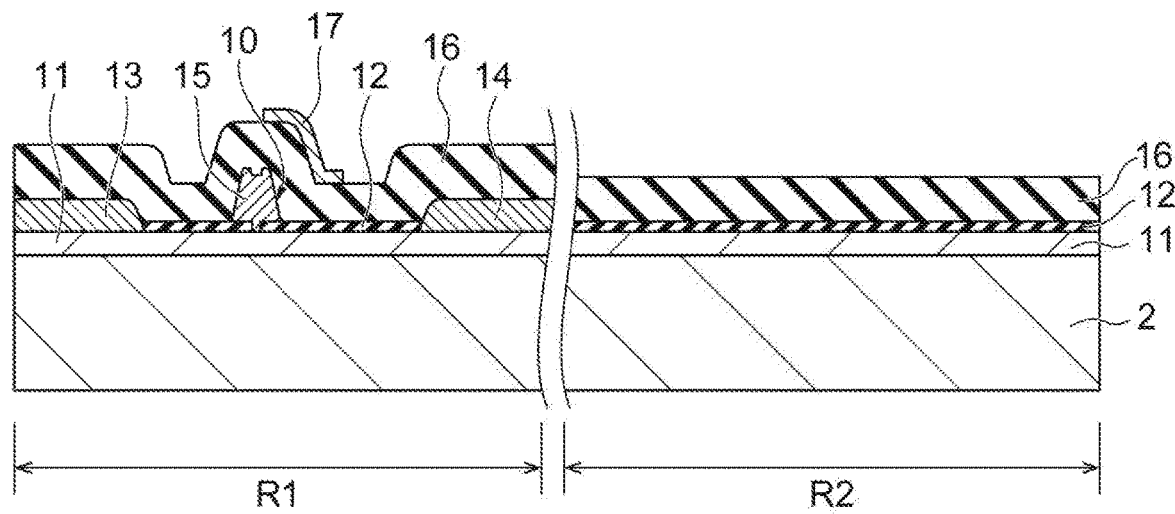
FIG. 3A and FIG. 3B are diagrams for explaining the method of manufacturing the semiconductor device according to the embodiment.

Next, as illustrated in FIG. 3A, the field plate 17 electrically coupled to the gate 15 of the transistor 10 is formed on the insulating film 16 positioned in the first region R1 (a third step). In the third step, for example, the field plate 17 including a Ti layer having a thickness of 5 nm and an Au layer having a thickness of 200 nm is formed using the evaporation method and the lift-off method with a resist pattern (not illustrated). The resist pattern is, for example, a pattern processing applied photoresist. The photoresist is, for example, a resist for ultraviolet exposure or a resist for electron beam exposure.

Figure 3B:
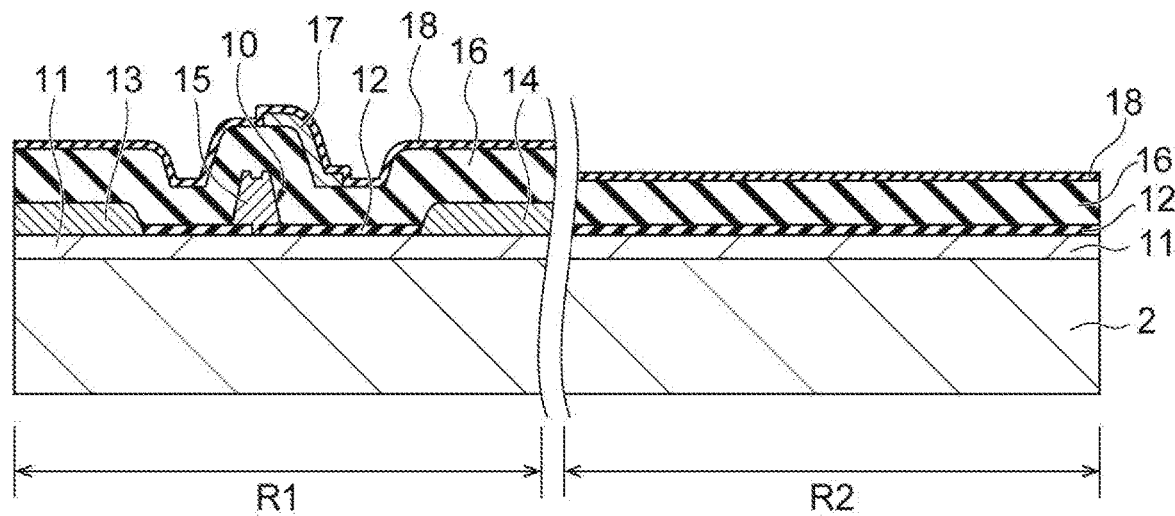

Next, as illustrated in FIG. 3B, the silicon nitride protective film 18 covering insulating film 16 and field plate 17 is formed (a fourth step). In the fourth step, the silicon nitride protective film 18 having a thickness of 100 nm is formed by the plasma CVD method, for example.

Figure 4A:
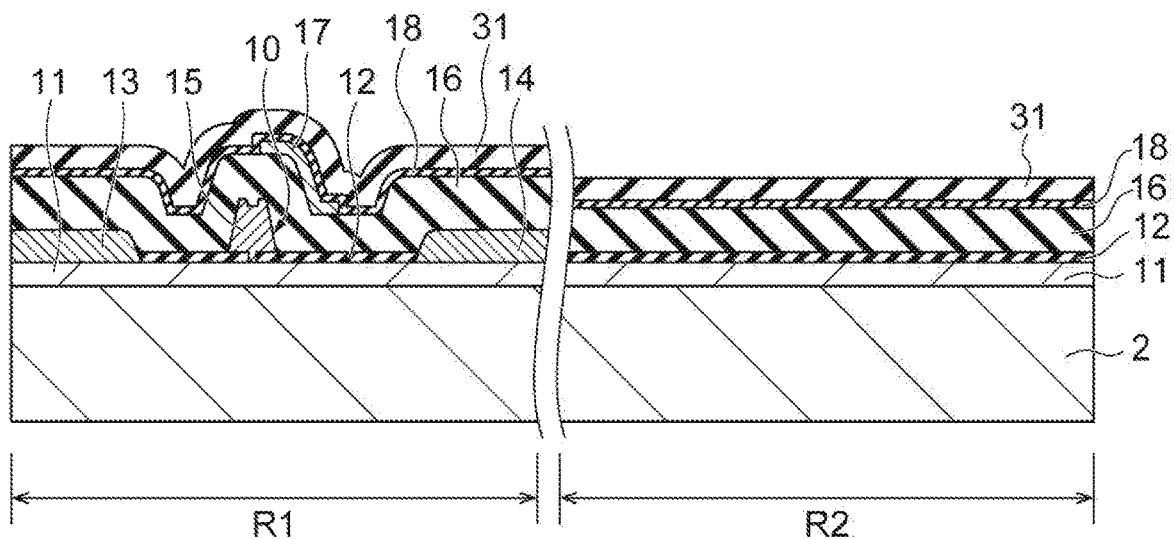
FIG. 4A and FIG. 4B are diagrams for explaining the method of manufacturing the semiconductor device according to the embodiment.

Next, as illustrated in FIG. 4A, the silicon oxide base film 31 is formed on the silicon nitride protective film 18 (a fifth step). In the fifth step, for example, a silicon oxide base film 31 having a thickness of 200 nm is formed by the plasma CVD method. The silicon oxide base film 31 is an insulating film that becomes the silicon oxide base film 24 later, and is formed in both the first region R1 and the second region R2.

Figure 4B:
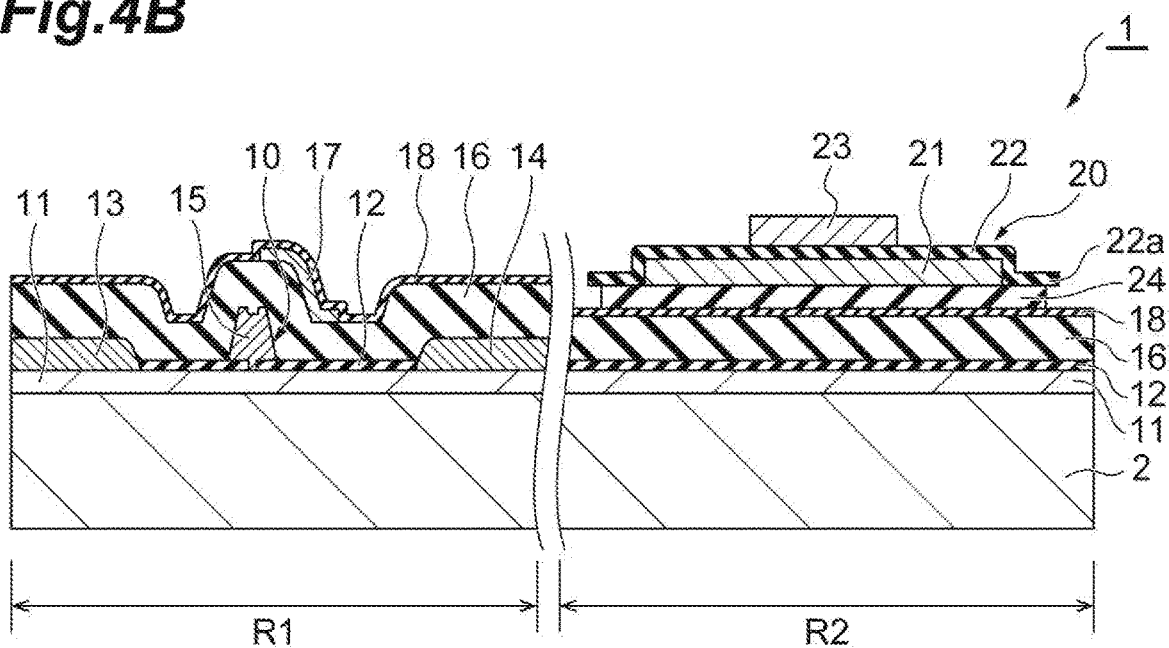

Next, as illustrated in FIG. 4B, the MIM capacitor 20 including the first electrode 21, the dielectric film 22 and the second electrode 23 stacked in an order is formed on the silicon oxide base film 24 obtained by processing a silicon oxide base film 31 (a sixth step). In this way, the semiconductor device 1 in which the transistor 10 and the MIM capacitor 20 are provided on the substrate 2 is manufactured.

Figure 5A:
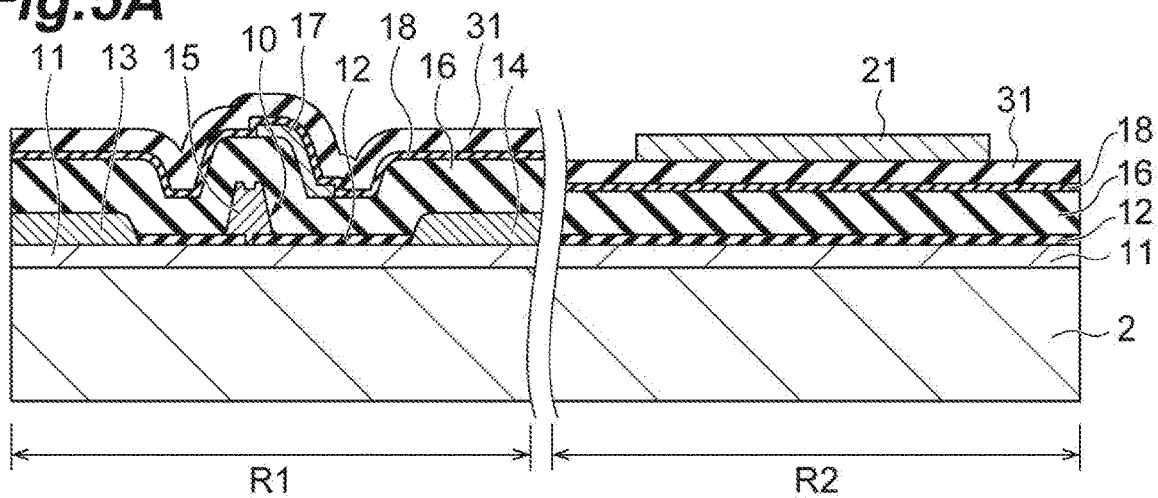
FIG. 5A to FIG. 5C are diagrams for explaining a sixth step.

The details of the sixth step will be described below with reference to FIG. 5A to FIG. 5C and FIG. 6A to FIG. 6C. FIG. 5A to FIG. 5C and FIG. 6A to FIG. 6C are diagrams for explaining the sixth step. In the sixth step, firstly, as illustrated in FIG. 5A, the first electrode 21 is formed on the silicon oxide base film 31 positioned in the second region R2 (an eleventh step). In the eleventh step, the patterned first electrode 21 is formed using the evaporation method and the lift-off method with the resist pattern (not illustrated). The first electrode 21 is formed on a part of the silicon oxide base film 31 in the second region R2.

Figure 5B:
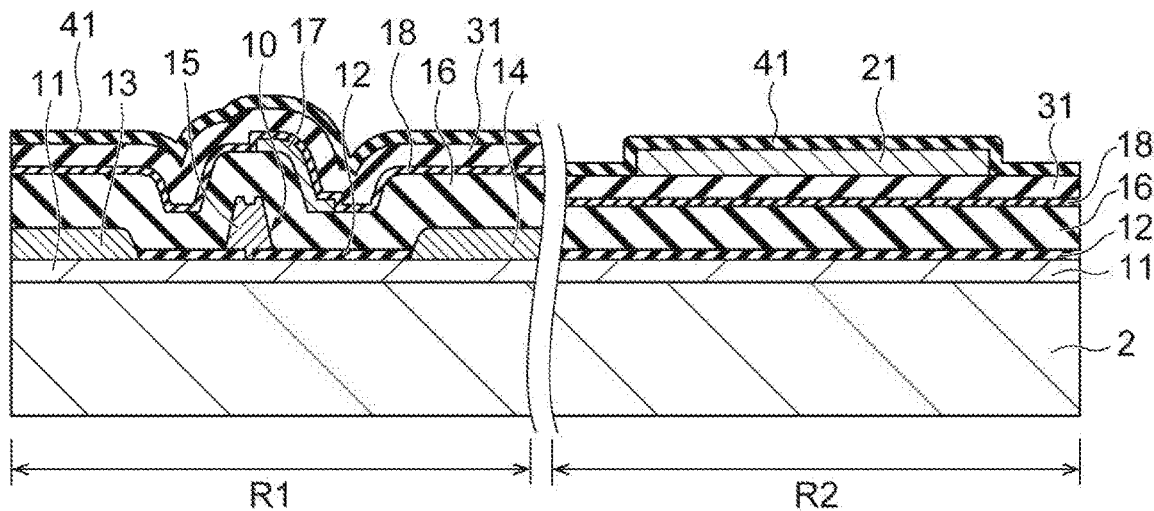

Next, as illustrated in FIG. 5B, a silicon nitride film 41 is formed on the first electrode 21 by the plasma CVD method (a twelfth step). The silicon nitride film 41 is an insulating film that becomes the dielectric film 22 later, and is formed in both the first region R1 and the second region R2.

Figure 5C:
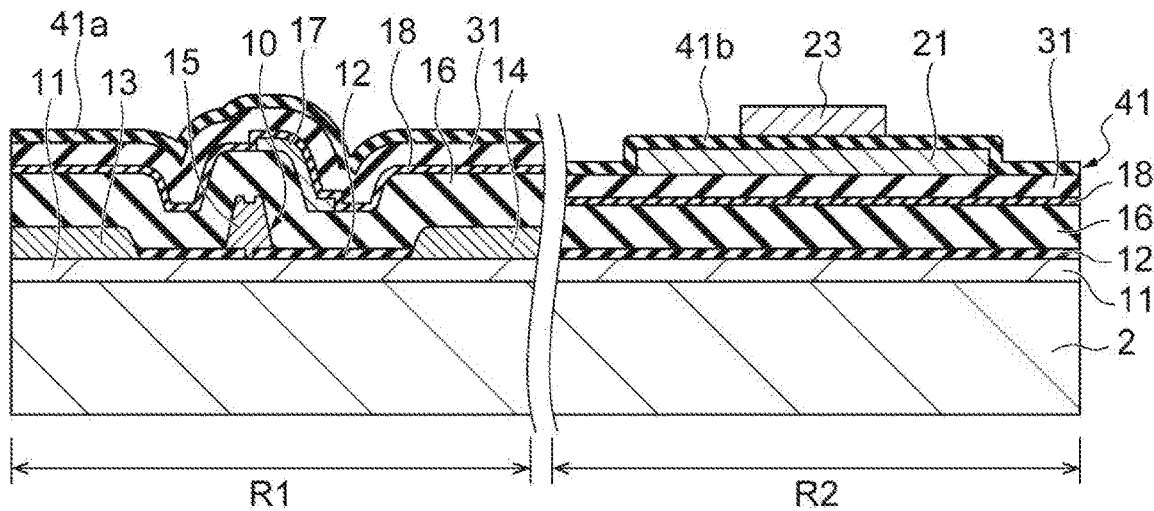

Next, as illustrated in FIG. 5C, the second electrode 23 is formed on the dielectric film 22 (a thirteenth step). In the thirteenth step, the patterned second electrode 23 is formed on the dielectric film 22 using the evaporation method and the lift-off method with the resist pattern (not illustrated).

Figure 6A:
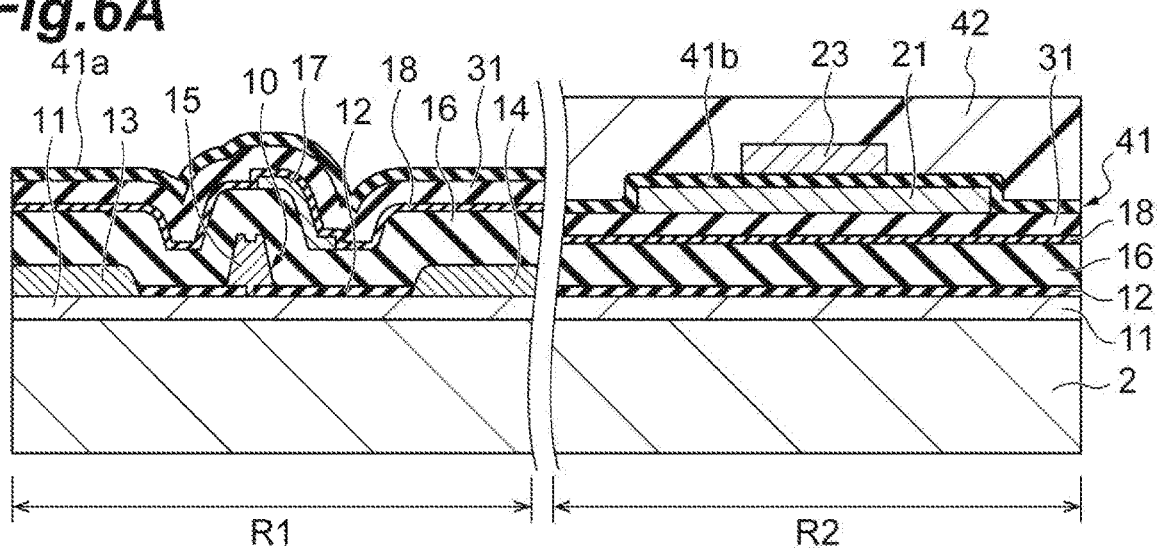
FIG. 6A to FIG. 6C are diagrams for explaining the sixth step.

Next, as illustrated in FIG. 6A, a resist pattern 42 is formed, which expose the silicon nitride film 41 positioned in other than the second region R2 where the MIM capacitor 20 is formed (a fourteenth step). In the fourteenth step, the resist pattern 42 is formed by a photolithography, for example. After the fourteenth step, a portion 41a of the silicon nitride film 41, which is positioned in the first region R1, is exposed from the resist pattern 42. On the other hand, the portion 41b of the silicon nitride film 41, which is positioned in the second region R2, is covered by the resist pattern 42.

Figure 6B:
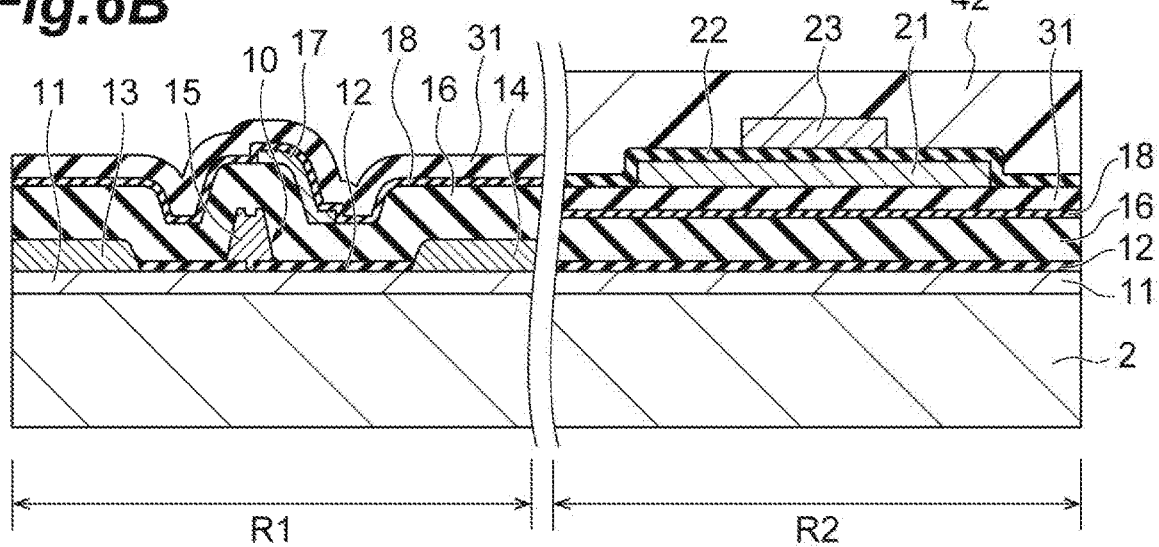

Next, as illustrated in FIG. 6B, the silicon nitride film 41 exposed from the resist pattern 42 is removed by dry etching using a fluorine-based gas, and then, the dielectric film 22 is formed (a fifteenth step). In the fifteenth step, the portion 41a of the silicon nitride film 41 is removed by dry etching. As a result, the remaining portion 41b of the silicon nitride film 41 is formed as the dielectric film 22. The silicon oxide base film 31 is provided immediately under the silicon nitride film 41. Here, an etching rate of the silicon nitride by the fluorine-based gas is significantly larger than that of the silicon oxide. Therefore, the silicon oxide base film 31 functions as an etching stopper for dry etching in the fifteenth step. The dry etching is, for example, reactive ion etching (RIE). As the fluorine-based gas, for example, one or more is selected from a group of $SF_6$, $CF_4$, $CHF_3$, $C_3F_6$, and $C_2F_6$. The RIE apparatus may be of an inductive coupled plasma (ICP) type.

Figure 6C:
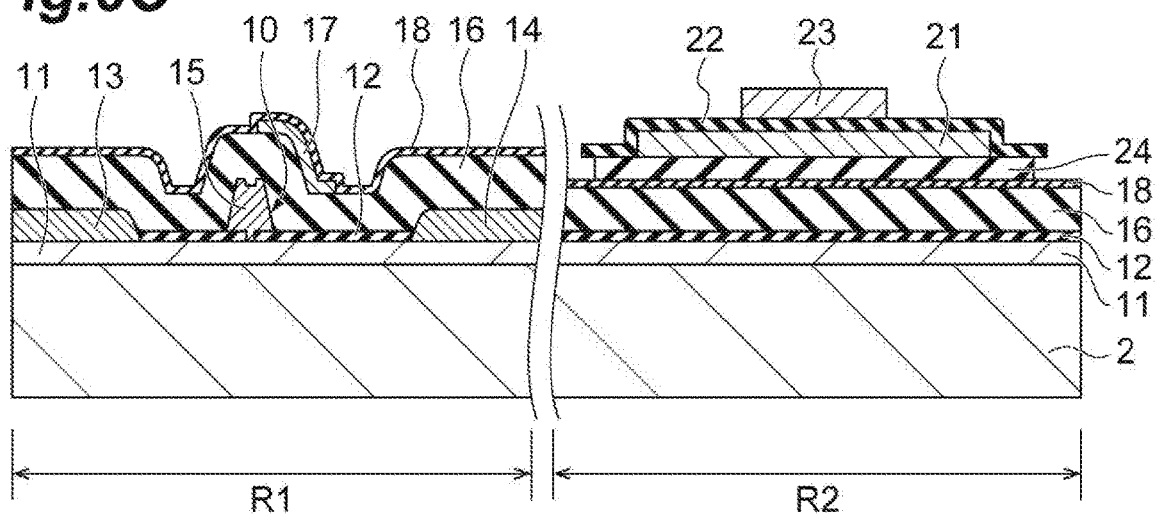

Next, as illustrated in FIG. 6C, wet etching is performed on the silicon oxide base film 31 on the field plate 17 (a sixteenth step). In the sixteenth step, the wet etching using buffered hydrofluoric acid which is a hydrofluoric acid solution is performed on the silicon oxide base film 31 exposed from the resist pattern 42 and the dielectric film 22. In this way, the silicon oxide base film 31 in the first region R1 is selectively removed. Thereafter, the resist pattern 42 provided in the second region R2 is removed.

When the buffered hydrofluoric acid is used as the hydrofluoric acid solution, the etching rate of silicon oxide film is approximately 300 nm/min, and the etching rate of the silicon nitride film is approximately 10 nm/min. Because of this difference in the etching rates, even after the sixteenth step, the silicon nitride protective film 18 positioned immediately under the silicon oxide base film 31 remains. Therefore, even after the sixteenth step, the field plate 17 is not exposed from the silicon nitride protective film 18.

Since the wet etching which is isotropic etching is performed in the sixteenth step, in addition to the portion of the silicon oxide base film 31 positioned in the first region R1, the side-etching is performed on the portion of the silicon oxide base film 31 positioned in the second region R2. In this way, the silicon oxide base film 24 is formed. In the sixteenth step, the dielectric film 22 is similarly formed by the side-etching. In view of the difference in etching rate described above, the side etching amount of the silicon oxide base film 31 is significantly larger than the side etching amount of the dielectric film 22. Therefore, after the sixteenth step, the end portion 22a of the dielectric film 22 becomes an eave of the silicon oxide base film 24.

Hereafter, the effect of the method of manufacturing the semiconductor device 1 according to the present embodiment is will be described while comparing with the method of manufacturing a semiconductor device according to a comparative example. First, the method of manufacturing the semiconductor device according to the comparative example will be described with reference to FIG. 7A to FIG. 7D.

Figure 7A:
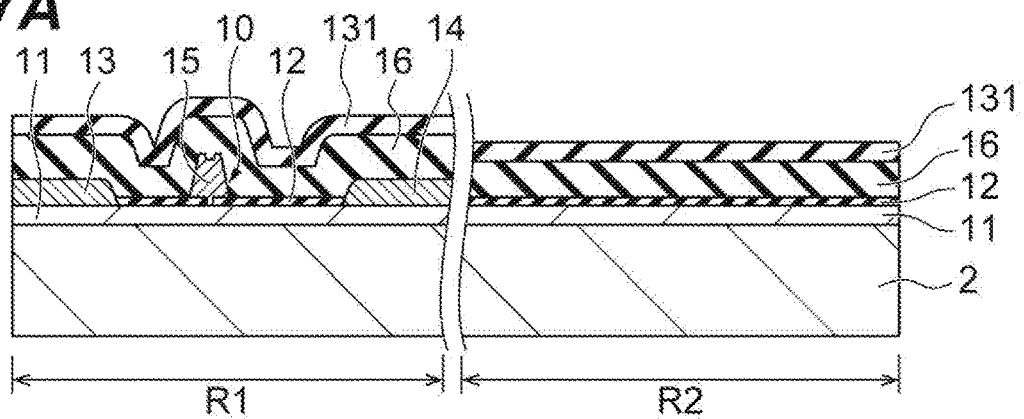
FIG. 7A to FIG. 7D are diagrams for explaining a method of manufacturing the semiconductor device according to a comparative example.
Figure 7B:
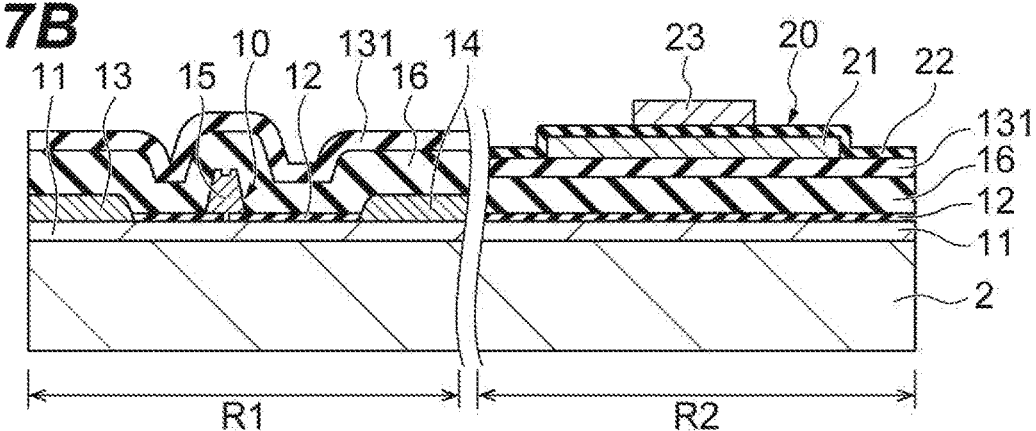
Figure 7C:
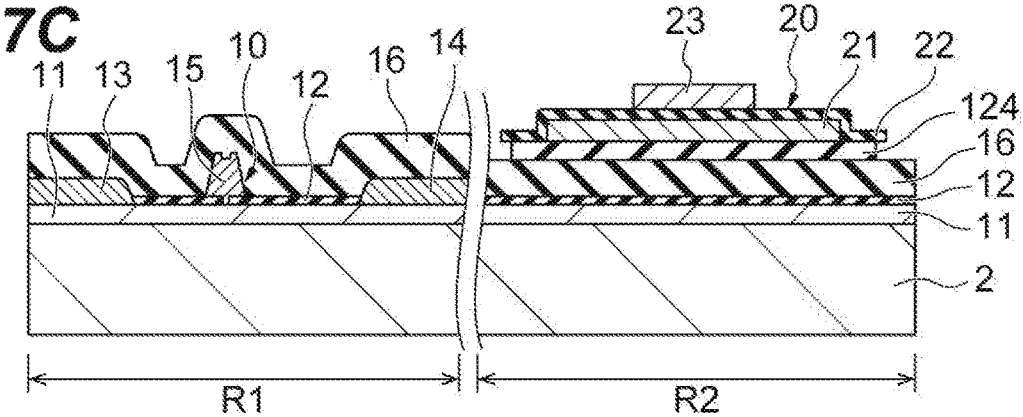
Figure 7D:
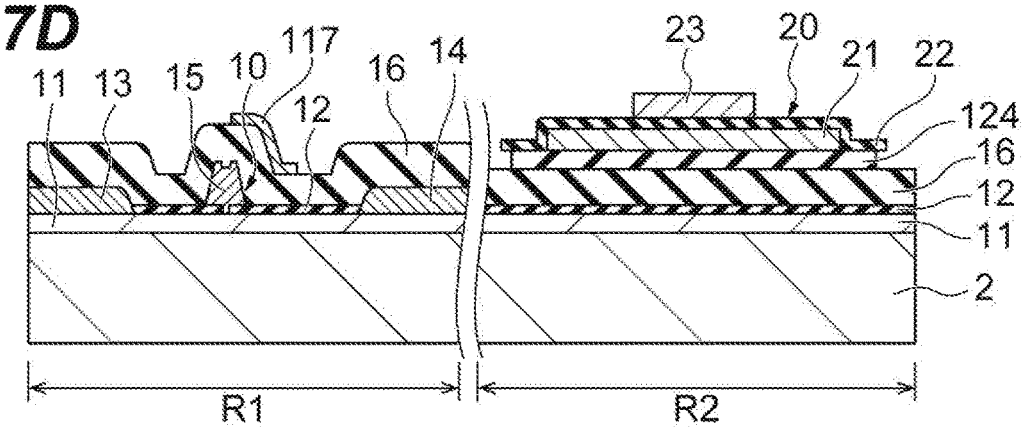

The method of manufacturing the semiconductor device according to the comparative example differs from the method of manufacturing the semiconductor device 1 according to the present embodiment in a point of sequential order of forming the MIM capacitor and the field plate. Specifically, as illustrated in FIG. 7A, in the method of manufacturing the semiconductor device according to the comparative example, the transistor 10 is covered by the insulating film 16, and then, the silicon oxide base film 131 is formed. In the related art, the silicon oxide base film 131 is provided immediately on the insulating film 16. Subsequently, as illustrated in FIG. 7B, the MIM capacitor 20 is formed in the second region R2. Subsequently, as illustrated in FIG. 7C, the wet etching using the hydrofluoric acid solution is performed on the silicon oxide base film 131, and then, the silicon oxide base film 124 and the dielectric film 22 including the end portion 22a are formed in the second region R2. Then, as illustrated in FIG. 7D, the field plate 117 is formed in the first region R1.

The field plate 117 formed by the method of manufacturing according to the above-described comparative example is provided on the insulating film 16 exposed by the wet etching performed on the silicon oxide base film 131. Since the etching using the hydrofluoric acid solution is performed on the surface of the insulating film 16 in the first region R1, the film quality of the insulating film 16 is degraded. In a case where the field plate 117 is formed on the insulating film 16 as described above, the withstand voltage between the gate 15 of the transistor 10 and the field plate 117 will deteriorate than expected.

On the other hand, according to the method of manufacturing the semiconductor device 1 in the present embodiment, first, the field plate 17 is formed on the insulating film 16 covering the transistor 10. Therefore, the field plate 17 can be formed on the insulating film 16 in which the film quality does not deteriorate by the wet etching or the like. In addition, according to the method of manufacturing described above, after covering the field plate 17 formed with the silicon nitride protective film 18, the silicon oxide base film 31 is formed on the silicon nitride protective film 18. Therefore, when performing the wet etching on the silicon oxide base film 31, the silicon nitride protective film 18 protects the field plate 17. In this way, it is possible to prevent the field plate 17 from being damaged during forming of the MIM capacitor 20, for example. Therefore, the deterioration of the withstand voltage between the gate 15 of the transistor 10 and the field plate 17 can be prevented, even if the MIM capacitor 20 is formed, it is possible to suppress the deterioration of the lifetime of the transistor 10.

In the present embodiment, after the sixteenth step of the wet etching on the silicon oxide base film 31, the end portion 22a of the dielectric film 22 becomes an eave of the silicon oxide base film 24. In this case, since a leakage path of the dielectric film 22 becomes long, the leakage current of the MIM capacitor 20 can be reduced.

In the present embodiment, the sixth step of forming the MIM capacitor 20 includes: the eleventh step of forming the first electrode 21 on the silicon oxide base film 31 using the evaporation method and the lift-off method; the twelfth step of forming the silicon nitride film 41 on the first electrode 21 using the plasma CVD method; the fourteenth step of forming the resist pattern 42 exposing the silicon nitride film 41 positioned in other than the second region R2 where the MIM capacitor 20 is formed; the fifteenth step of removing the silicon nitride film 41 exposed from the resist pattern 42 and forming the dielectric film 22 by dry etching using the fluorine-based gas; and the sixteenth step of performing the wet etching using the hydrofluoric acid solution on the silicon oxide base film 31 exposed from resist pattern 42 and dielectric film 22. In addition, in the present embodiment, the sixth step of forming the MIM capacitor 20 includes the thirteenth step of forming the second electrode 23 using the evaporation method and the lift-off method before the sixteenth step. Therefore, the MIM capacitor 20 can be formed without damaging the field plate 17.

The method of manufacturing the semiconductor device 1 according to the present embodiment includes the step of forming the passivation film 12 covering the substrate 2 before the completion of the forming of the transistor 10. Therefore, the semiconductor surface of the transistor 10 can be protected.

The method of manufacturing the semiconductor device according to the present disclosure is not limited to the above-described embodiment, and various other modifications can be available. For example, the above embodiment describes an example of applying the present disclosure to the HEMTs, however, the method of manufacturing in the present disclosure is applicable to various field effect transistors other than the HEMTs.

What is claimed is:

1. A method of manufacturing a semiconductor device, comprising:
    forming a field plate on an insulating film covering a transistor, the transistor being located on a substrate;
    forming a silicon nitride protective film covering the insulating film and the field plate;
    forming a silicon oxide base film on the silicon nitride protective film; and
    forming a MIM capacitor on the silicon oxide base film, the MIM capacitor including a first electrode, a dielectric film and a second electrode which are stacked in an order,
    wherein the forming the MIM capacitor includes performing wet etching on a portion of the silicon oxide base film formed on the field plate after forming the dielectric film.

2. The method of manufacturing a semiconductor device according to claim 1, wherein an end portion of the dielectric film corresponds to an eave of the silicon oxide base remaining after the performing of the wet etching on the portion of the silicon oxide base film formed on the field plate.

3. The method of manufacturing a semiconductor device according to claim 1,
wherein the forming the MIM capacitor includes:
forming a first electrode on the silicon oxide base film using an evaporation method and a lift-off method;
forming a silicon nitride film on the first electrode using a plasma CVD method;
forming a resist pattern exposing the silicon nitride film positioned in a first region other than a second region where the MIM capacitor is formed;
removing the silicon nitride film exposed from the resist pattern by dry etching using a fluorine-based gas, and forming the dielectric film; and
performing the wet etching using a hydrofluoric acid solution on the silicon oxide base film exposed from the dielectric film and the resist pattern in the first region.

4. The method of manufacturing a semiconductor device according to claim 1,
wherein the forming the MIM capacitor includes forming the second electrode using an evaporation method and a lift-off method before performing the wet etching.

5. The method of manufacturing a semiconductor device according to claim 1, further comprising forming a passivation film covering the substrate, before a completion of forming of the transistor.

6. The method of manufacturing a semiconductor device according to claim 1, wherein
the transistor has a gate; and
the field plate is formed to be electrically coupled to the gate of the transistor via the insulating film.

* * * * *